United States Patent [19]

Gilmore et al.

[11] Patent Number: 5,147,731

[45] Date of Patent: Sep. 15, 1992

[54] STABILIZED ZIRCONIA/COCRALY HIGH TEMPERATURE COATING

[75] Inventors: Charles M. Gilmore, Great Falls, Va.; Earl F. Skelton, Washington, D.C.; Louis F. Aprigliano, Riva, Md.; Syed B. Qadri, Alexandria, Va.

[73] Assignee: The United States of America as represented by the Secretary of the Navy, Washington, D.C.

[21] Appl. No.: 759,149

[22] Filed: Sep. 11, 1991

Related U.S. Application Data

[63] Continuation of Ser. No. 574,855, Aug. 30, 1990, abandoned.

[51] Int. Cl.$^5$ ............................................. B32B 15/04
[52] U.S. Cl. ..................................... 428/633; 428/697; 428/938
[58] Field of Search ................. 428/632, 633, 697, 938

[56] References Cited

U.S. PATENT DOCUMENTS

| | | | |
|---|---|---|---|
| 3,975,165 | 8/1976 | Elbert et al. | 428/633 |
| 4,248,940 | 2/1981 | Goward et al. | 428/678 |
| 4,255,495 | 3/1981 | Levine et al. | 428/632 |
| 4,321,310 | 3/1982 | Ulion et al. | 428/633 |
| 4,321,311 | 3/1982 | Strangman | 428/633 |
| 4,328,285 | 5/1982 | Siemers et al. | 428/633 |
| 4,639,399 | 1/1987 | Aprigliano | 428/632 |
| 4,861,618 | 8/1989 | Vine et al. | 427/34 |
| 4,880,614 | 11/1989 | Strangman et al. | 428/623 |
| 4,889,776 | 12/1989 | Priceman | 428/660 |
| 4,927,714 | 5/1990 | Priceman | 428/628 |
| 4,942,732 | 7/1990 | Priceman | 428/629 |

FOREIGN PATENT DOCUMENTS

60-243259 12/1985 Japan.
62-67160 3/1987 Japan.

OTHER PUBLICATIONS

Grisik, J. J. et al., "Performance of Second Generation Airfoil Coatings in Marine Service", *Thin Solid Films*, vol. 73, pp. 397-406 (1980).
Hwang, S. Y. et al., "The Initial Stages of Hot Corrosion Attack of CoCrAlY Alloys at 700° C.," *Hot Temperature Protective.*

*Primary Examiner*—George Wyszomerski
*Attorney, Agent, or Firm*—Luther A. Marsh; Gary G. Borda; Sol Sheinbein

[57] ABSTRACT

A corrosion resistant structure having an outer ceramic layer of alumina stabilized zirconia resistant to oxidation at high temperatures, over a base alloy selected from the group consisting of CoCrAlY and NiCrAlY and applied to the base alloy by physical vapor deposition process, such as reactive magnetron sputtering wherein the outer ceramic layer has a thickness of from about 0.5 μm to about 200 μm.

6 Claims, No Drawings

STABILIZED ZIRCONIA/COCRALY HIGH TEMPERATURE COATING

The invention described herein may be manufactured and used by or for the Government of the United States of America for governmental purposes without the payment of any royalties thereon or therefor.

This application is a continuation of application Ser. No. 07/574,855, filed Aug. 30, 1990, now abandoned.

BACKGROUND OF THE INVENTION

1. Field of the Invention

This invention is directed to providing a means to extend the high temperature corrosion life of gas turbine blades.

2. Brief Description of the Prior Art

Gas turbine engines are used for power generation in many instances. They are used in marine environments also and therein the blades and vanes suffer a form of material degradation known as hot corrosion. The hot corrosion process involves the interaction of the metal blade and vane surfaces with the sulfur dioxide and sea salt present in the combustion gases within the engine. The solution to this problem has been to develop special metallic coatings to extend the services life of these parts. These coatings are often a mixture of cobalt, chromium, aluminum and yttrium. These coatings are identified as a class by the acronym CoCrAlY.

The hot corrosion process in a marine environment has been designated type 2 or low-temperature hot corrosion. The major parameters of the hot corrosion process are: sulfur in the fuel forms sulfur dioxide during combustion, sulfur dioxide reacts with the cobalt in the turbine blade coating and forms cobalt sulfate, sodium sulfate from the sea salt ingested by the engine deposits in solid form on the turbine blades; and, in the temperature range of about 677° C. to about 732° C., the operating temperature of the engine in a marine environment, the sodium sulfate and the cobalt sulfate form a mixed salt that has a lower melting point than either of the pure salts. This lower melting point of this mixed salt results in the degradation of the coating.

The hot corrosion process can be stopped by preventing the formation of cobalt sulfate. The aluminum scale that forms on these coatings should do just that. However, it is now known that the aluminum scales on these coatings contain yttrium and the yttria-rich phases in these oxide scales provides initiation sites for the hot corrosion process. This invention avoids these problems and enhances the hot corrosion process life by putting a ceramic layer onto the outer surface of the CoCrAlY which is not easily defeated by the hot corrosion process.

SUMMARY OF THE INVENTION

This invention provides a corrosion resistant structure for application on high temperature corrosion resistant coatings to extend the high temperature corrosion life of gas turbine blades having an outer ceramic skin resistant to oxidation at high temperatures over a base alloy selected from the group consisting of CoCrAlY and NiCrAlY, said outer ceramic layer consisting of alumina stabilized zirconia and applied to said base alloy by physical vapor deposition and said outer ceramic layer having a thickness of from about 0.5 $\mu$m to about 200 $\mu$m.

OBJECTS OF THE INVENTION

An object of the present invention is to provide an improved corrosion resistant structure for use in extending the high temperature corrosion life of gas turbine blades.

Another object of the present invention is to provide an improved corrosion resistant structure for use in extending the high temperature corrosion life of gas turbine blades wherein said life of gas turbine blades is extended by at least five times.

Another object of this invention is to provide a corrosion resistant structure having an outer ceramic skin resistant to oxidation at high temperatures for use in increasing the life of the gas turbine blade.

With other objects in view, this invention also provides a method for making an improved corrosion resistant structure for use in extending the high temperature corrosion life of gas turbine blades by the application of a layer of alumina stabilized zirconia to the surface of the base alloy selected from the group consisting of CoCrAlY and NiCrAlY.

DETAILED DESCRIPTION OF THE INVENTION

The present invention provides a means to extend the high temperature corrosion life of gas turbine blades. The novel feature of the invention is to provide an improved corrosion resistant structure having an outer ceramic skin/coating resistant to oxidation at high temperatures over a base alloy of CoCrAlY or NiCrAlY wherein the outer ceramic layer is alumina stabilized zirconia in a thickness amount of from about 0.5 $\mu$m to about 200 $\mu$m.

The base alloy thickness is from about 0.08 mm to about 0.2 mm. The base alloy composition consists of from about 15 to about 35 weight percent of chromium, from about 5 to about 13 weight percent of aluminum, from about 0.0 to about 1.0 weight percent of yttrium and the balance selected from the group of cobolt and nickel. The stabilized zirconium consists of from about 40 to about 50 weight percent zirconium, from about 32 to about 36 weight percent oxygen and from about 18 to 24 weight percent selected from the group consisting of aluminum and cerium.

The layer or coating must be thin in order to resist spalling from the CoCrAlY or NiCrAlY coating during the thermal cycles experienced in a gas turbine engine.

The application of the zirconia can be carried out by physical vapor deposition processes, such as reactive magnetron sputter deposition, or by the process of plasma spraying. The reactive magnetron sputtering has been found to be preferable as it allows the coatings to be applied in the proper thickness amounts without subsequent detrimental effects. If the coating is too thin it will be eroded too rapidly by the high velocity gases in the engine. If the coating is too thick, it will spall from the CoCrAlY/NiCrAlY during engine thermal cycling.

Two coating compositions tested successfully in a hot corrosion environment are illustrated. One coating composition contained 18 weight percent aluminum, 50 weight percent zirconium and 32 weight percent oxygen. The other coating composition contained 24 weight percent aluminum, 40 weight percent zirconium and 36 weight percent oxygen. Cerium was substituted for aluminum in the same amounts and also showed successful results. It was observed that if aluminum or cerium was less than 14 weight percent then the composition is not successful. It was observed that such a low level of aluminum or cerium is insufficient to stabilize the zirconia that forms in the coating and spallation results upon thermal cycling. Thus, the zirconia to be stabilized requires from about 18 to about 24 weight percent aluminum or cerium.

The tests were carried out in a burner rig shown to simulate the hot corrosion environment encountered in marine gas turbines. The tests involved the burning of marine diesel fuel with 1 weight percent sulfur containment and 10 parts per million of sea salt injected with the combustion air. The tests were carried out for 500 hours. The samples were thermally cycled to room temperature every 24 hours. At the end of the test, the coatings showed little, if any, signs of hot corrosion attack. The control specimen having no zirconia coating was extensively attacked. Upon subsequent and continued testing, it was observed that the coating of this invention increases the life of the turbine blade by at least five times.

What is claimed is:

1. A corrosion resistant structure comprising an outer ceramic layer resistant to oxidation at high temperatures over a base alloy selected from the group consisting of CoCrAlY and NiCrAlY, said outer ceramic layer being comprised of alumina stabilized zirconia, wherein said alumina stabilized zirconia consists of from about 40 to about 50 weight percent zirconium, from about 32 to about 36 weight percent oxygen and from about 18 to about 24 weight percent aluminum, and wherein said outer ceramic layer has been applied to said base alloy by physical vapor deposition, and further wherein said outer ceramic layer has a thickness of from about 0.5 $\mu$m to about 200 $\mu$m.

2. A corrosion resistant structure as in claim 1 wherein said base alloy is CoCrAlY.

3. A corrosion resistant structure as in claim 1 wherein said base alloy is NiCrAlY.

4. A corrosion resistant structure as in claim 1 wherein the base alloy thickness is from about 0.08 mm to about 0.2 mm.

5. A corrosion resistant structure as in claim 4 wherein the base alloy composition consists of from about 15 to about 35 weight percent of chromium, from about 5 to about 13 weight percent of aluminum, from about 0.0 to about 1.0 weight percent of yttrium and the balance selected from the group consisting of cobalt and nickel.

6. A corrosion resistant structure as in claim 1 wherein said physical vapor deposition is by reactive magnetron sputtering.

* * * * *